(12) United States Patent
Kuan et al.

(10) Patent No.: US 7,358,576 B2
(45) Date of Patent: Apr. 15, 2008

(54) WORD LINE STRUCTURE WITH SINGLE-SIDED PARTIALLY RECESSED GATE STRUCTURE

(75) Inventors: Shih-Fan Kuan, Taoyuan County (TW); Kuo-Chien Wu, Miaoli (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 11/246,428

(22) Filed: Oct. 7, 2005

(65) Prior Publication Data

US 2006/0030091 A1     Feb. 9, 2006

Related U.S. Application Data

(62) Division of application No. 10/858,032, filed on Jun. 1, 2004, now Pat. No. 6,991,978.

(30) Foreign Application Priority Data

Jan. 29, 2004 (TW) ............................... 93101946 A

(51) Int. Cl.
*H01L 29/72* (2006.01)
(52) U.S. Cl. ...................................... 257/396; 257/330
(58) Field of Classification Search ................ 257/396, 257/330
See application file for complete search history.

(56) References Cited

U.S. PATENT DOCUMENTS

| 5,474,947 | A | * | 12/1995 | Chang et al. | ............... | 438/257 |
| 6,844,591 | B1 | * | 1/2005 | Tran | ........................... | 257/330 |
| 6,992,010 | B2 | * | 1/2006 | Chou et al. | ................. | 438/694 |
| 2002/0034869 | A1 | * | 3/2002 | Kao | ........................... | 438/593 |

* cited by examiner

*Primary Examiner*—Edward Wojciechowicz
(74) *Attorney, Agent, or Firm*—Quintero Law Office

(57) ABSTRACT

A word line structure with a single-sided partially recessed gate structure. The word line structure includes a gate structure, a first gate spacer, and a second gate spacer. The gate structure includes a gate dielectric layer, a first gate layer, a second gate layer, and a gate capping layer and has a recess region adjacent to one of opposing sidewalls of the second gate layer. The first gate spacer is disposed over opposing sidewalls of the gate dielectric layer and the first gate layer. The second gate spacer is disposed over opposing sidewalls of the gate structure and covers the first gate spacer. A method for forming a word line structure with a single-sided partially recessed gate structure is also disclosed.

6 Claims, 5 Drawing Sheets

WORD LINE STRUCTURE WITH SINGLE-SIDED PARTIALLY RECESSED GATE STRUCTURE

This application is a divisional of U.S. Application No. 10/858,032, filed June 1, 2004 now U.S. Pat. No. 6,991,978.

BACKGROUND OF THE INVENTION

1. Field of the Invention

The present invention relates in general to a semiconductor device, and more particularly, to a word line structure with a single-sided partially recessed gate structure.

2. Description of the Related Art

A dynamic random access memory (DRAM) is a common semiconductor memory device widely employed in electronic products. In order to increase the density of the memory devices and improve performance thereof, the size of memory devices must be reduced. The fabrication of conductive plugs connected to the bit lines and disposed between the word lines, however, becomes more difficult as memory device geometries continue to decrease in size. Therefore, many self-aligned processes have been developed for bit line contact fabrication, which are useful for the fabrication of the subsequent conductive plug. If the gate capping layer and the gate spacer of the word line are over etched during fabrication of the self-aligned bit line contact, a short circuit between the word line and the subsequent conductive plug may occur. Conversely, if the gate capping layer and the gate spacer of the word line are under etched during fabrication of the self-aligned bit line contact, the bit line contact may fail, resulting in an open circuit of the bit line after formation of the conductive plug with poor electrical connection.

In order to solve such problems, a word line structure with a double-sided partially recessed gate structure has been suggested. FIGS. 1a to 1e are cross-sections showing a conventional method of forming a word line structure with a double-sided partially recessed gate structure for a DRAM.

First, in FIG. 1a, a silicon substrate 100 is provided. The substrate 100 may contain semiconductor devices, such as capacitors and resistors, used in the memory devices. Here, in order to simplify the diagram, only a flat substrate is depicted. A pair of adjacent gate structures 110 is formed on the silicon substrate 100 for the fabrication of the word lines. The gate structure 110 can be a stacked layer comprising a gate dielectric layer 102, a first gate layer 104, a second gate layer 106, and a gate capping layer 108. The gate dielectric layer 102 can be a silicon oxide layer. The first gate layer 104 can be a polysilicon layer. The second gate layer 106 can be a tungsten silicide layer which serves as a portion of the gate electrode to reduce contact resistance thereof. The gate capping layer 108 can be a silicon nitride layer.

Next, in FIG. 1b, opposing sidewalls of the second gate layer 106 are etched by suitable chemical solution to form a double-sided partially recessed second gate layer 106a with a width less than the overlying gate capping layer 108 and the underlying first gate layer 104, constituting a double-sided partially recessed gate structure 110a. During etching, however, the gate dielectric layer 102 of the gate structure 110a is also etched, resulting in undercut, as depicted by the arrows 111 in FIG. 1b, and decreasing device properties.

Next, in FIG. 1c, an insulating layer 112, such as a silicon nitride layer, is conformably formed on the substrate 200 and the surfaces of both gate structures 110a by conventional deposition, such as chemical vapor deposition (CVD).

Next, in FIG. 1d, an anisotropic etching, such as reactive ion etching (RIE), is performed on the insulating layer 112 to form a gate spacer 112a over opposing sidewalls of each gate structure 110a and expose the surface of the substrate 100, then the fabrication of the word lines is completed.

Thereafter, a dielectric layer (not shown), such as a borophosphosilicate glass (BPSG) layer, is formed overlying the substrate 100 covering each gate structure 110a and each gate spacer 112a. Next, the dielectric layer is etched using the gate capping layers 108 as etching stop layers to leave a portion of dielectric layer 114. Another dielectric layer 116, such as a tetraethyl orthosilicate (TEOS) oxide layer, is deposited on the gate structures 11a and the remaining dielectric layer 114. Next, a photoresist pattern layer 118 is formed on the dielectric layer 116 by conventional photolithography, leaving an opening 120 to expose a bit line contact region.

Finally, in FIG. 1e, the dielectric layers 116 and 114 under the opening 120 are successively removed to form a bit line contact 122 exposing the surface of the substrate 100. Next, a copper layer (not shown) is deposited on the dielectric layer 116 and fills the bit line 122. The copper layer is subsequently removed by chemical mechanical polishing (CMP) using the dielectric layer 116 as an etching stop layer, to leave a portion of copper layer 124 serving as a conductive plug to electrically connect the bit line (not shown) with the substrate 100.

However, in this method, since the second gate layer 106 is partially etched prior to the formation of the bit line contact 122, the top area of the double-sided partially recessed second gate layer 106a is significantly reduced, increasing the contact resistance of the word line.

SUMMARY OF THE INVENTION

Accordingly, an object of the present invention is to provide a novel word line structure with a single-sided partially recessed gate structure and the method for forming the same, which can prevent short circuit between the word line and the conductive plug connected to the bit line or prevent the bit line from opening due to poor electrical connection of the conductive plug.

Another object of the present invention is to provide a novel word line structure with a single-sided partially recessed gate structure and the method for forming the same, in which the single-sided partially recessed gate structure has a recess region near the bit line contact, instead of the conventional double-sided partially recessed gate structure, thereby preventing the contact resistance of the word line from increasing.

According to objects of the invention, a method of forming a word line structure with a single-sided partially recessed gate structure is provided. A substrate having a gate structure thereon is provided, wherein the gate structure comprises a gate dielectric layer, a first gate layer, a second gate layer, and a gate capping layer. A first gate spacer is formed over opposing sidewalls of the gate dielectric layer and the first gate layer and the second gate spacer is formed over opposing sidewalls of the gate structure to cover the first gate spacer. A dielectric layer is formed overlying the substrate and covers the gate structure and the second gate spacer. The dielectric layer and the second gate spacer, adjacent to one of the sidewalls of the gate structure, are successively removed to expose portions of the substrate, the gate capping layer, the second gate layer, and the first gate spacer. The exposed second gate layer is partially etched to form a recess region in the gate structure. A third gate spacer is formed over the sidewall of the gate structure exposing the gate capping layer, the second gate layer, and the first gate spacer and fills the recess region to complete the word line structure.

The first gate layer can be a polysilicon layer and the second gate layer can be a metal silicide layer. The gate capping layer and the first gate spacer can comprise silicon nitride. The dielectric layer can comprise borophosphosilicate glass (BPSG) and tetraethyl orthosilicate (TEOS) oxide. The second and third gate spacers can comprise silicon oxide.

Moreover, the exposed second gate layer can be partially etched using a mixture of ammonia ($NH_3$) and hydrogen peroxide ($H_2O_2$). The recess region has a depth of about 100 to 200 Å.

Additionally, according to objects of the invention, a word line structure with a single-sided partially recessed gate structure is provided. The word line structure includes a gate structure, a first gate spacer, and a second gate spacer. The gate structure includes a gate dielectric layer, a first gate layer, and a second gate layer, in which the gate structure has a recess region adjacent to one of the sidewalls of the second gate layer. The first gate spacer is disposed over opposing sidewalls of the gate dielectric layer and the first gate layer. The second gate spacer is disposed over opposing sidewalls of the gate structure and covers the first gate spacer.

The first gate layer can be a polysilicon layer and the second gate layer can be a tungsten silicide layer. The gate capping layer and the first gate spacer can comprise silicon nitride. The second and third gate spacers can comprise silicon oxide.

Moreover, the recess region has a depth of about 100 to 200 Å.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 2a to 2g are cross-sections showing a method for forming a word line structure with a single-sided partially recessed gate structure for a semiconductor device, such as a DRAM.

Figure 1A:
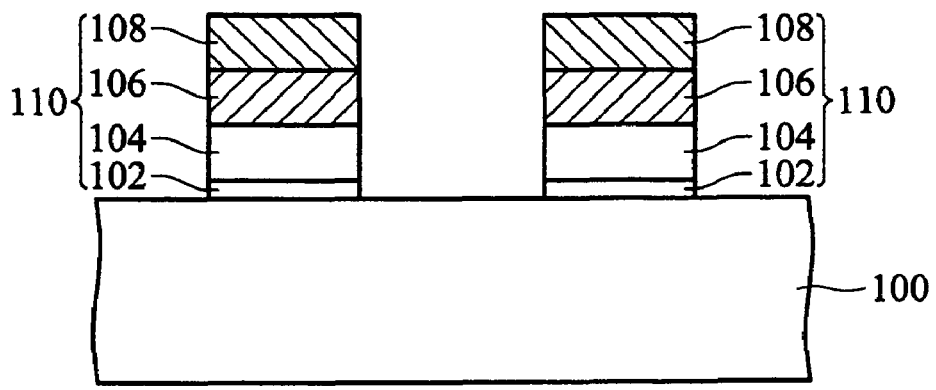
FIGS. 1a to 1e are cross-sections showing a conventional method for forming a word line structure with a double-sided partially recessed gate structure.
Figure 1B:
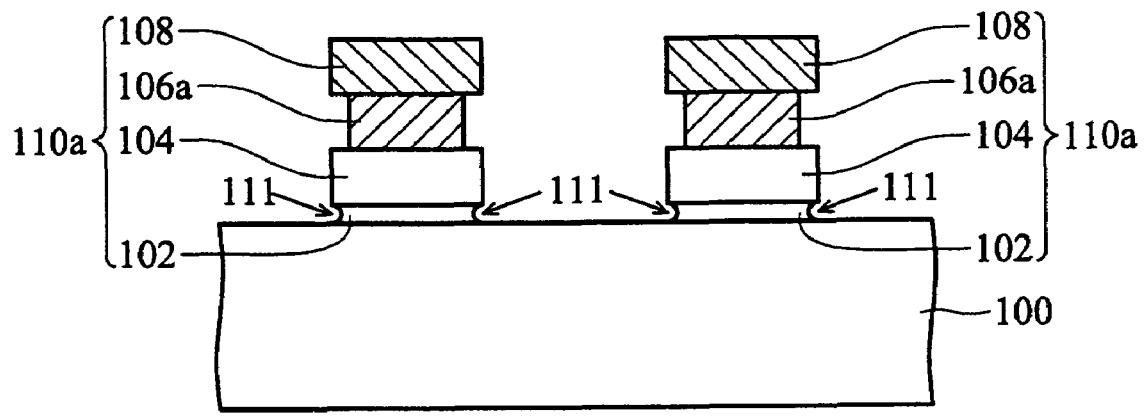
Figure 1C:
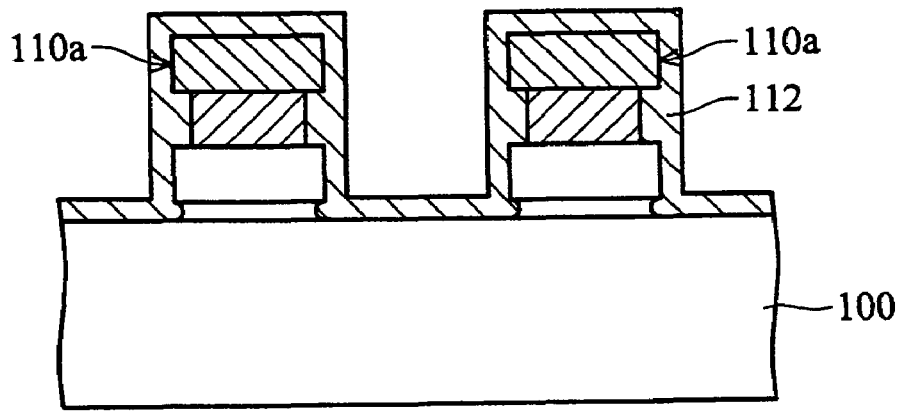
Figure 1D:
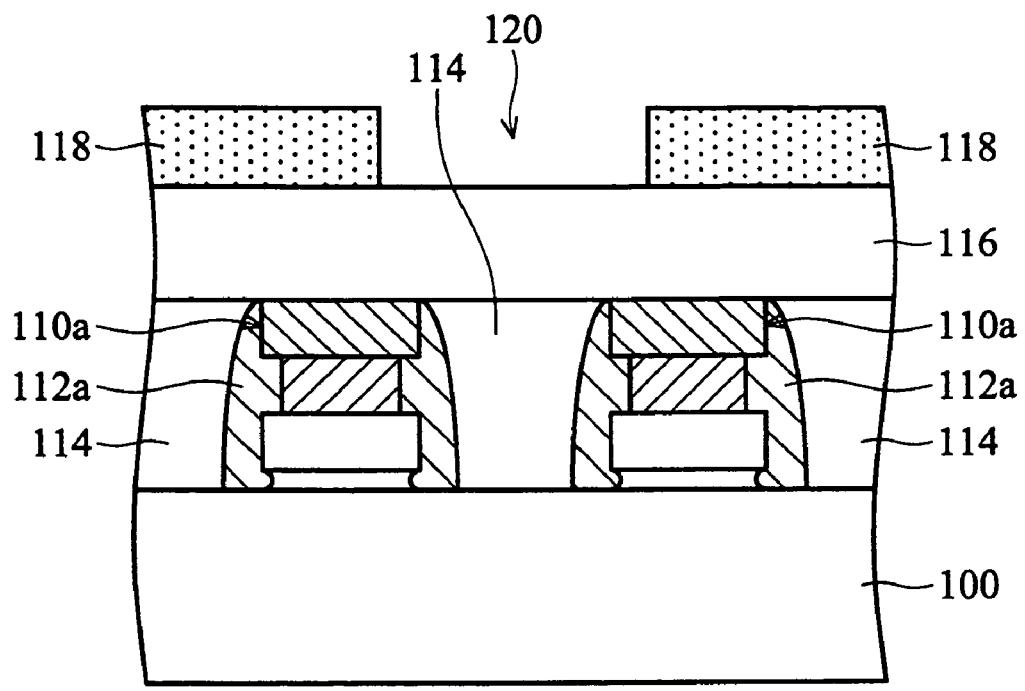
Figure 1E:
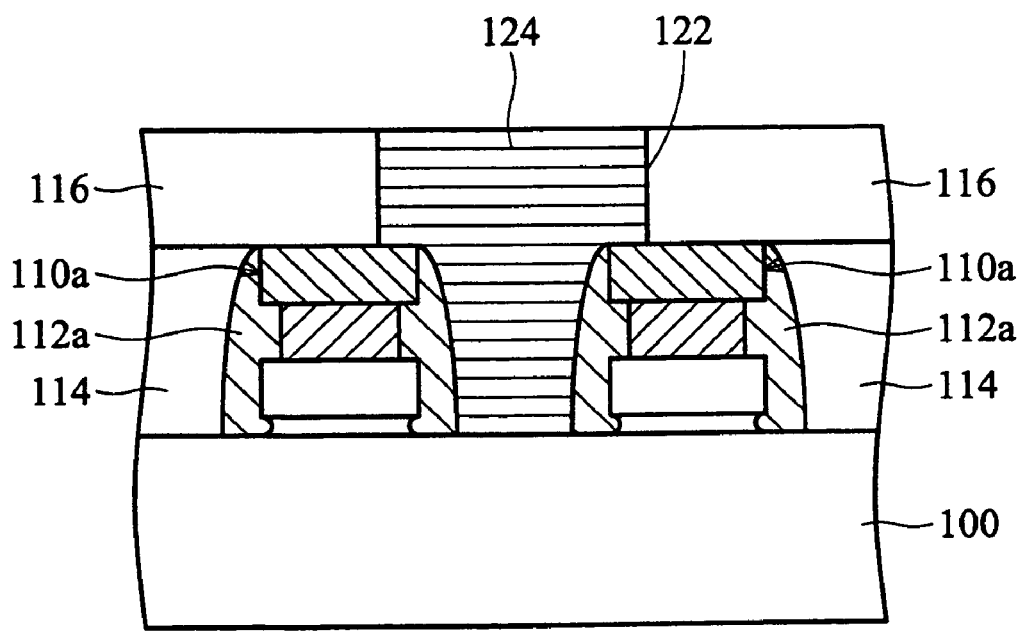
Figure 2A:
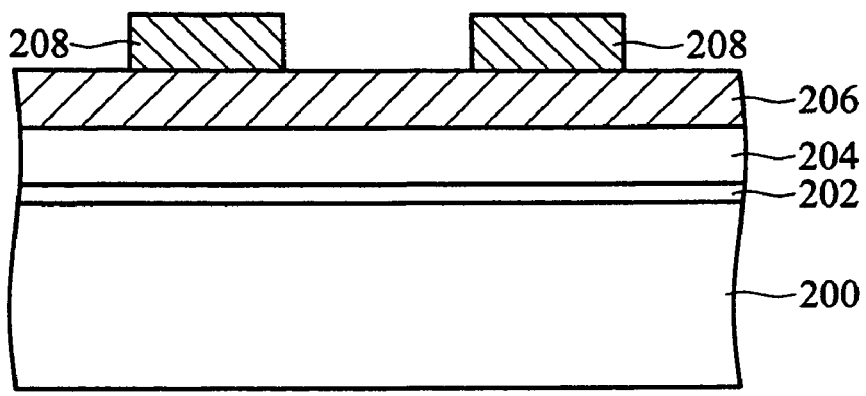
FIGS. 2a to 2g are cross-sections showing a method for forming a word line structure with a single-sided partially recessed gate structure of the present invention.

First, in FIG. 2a, a substrate 200, such as a silicon substrate, is provided. The substrate 200 may contain semiconductor devices, such as capacitors and resistors, used in the memory devices. Here, in order to simplify the diagram, only a flat substrate is depicted. Next, a dielectric layer 202, a first conductive layer 204, a second conductive layer 206, and a capping layer (not shown) are successively formed overlying the substrate 200.

In the invention, the dielectric layer 202 is used for definition of a gate dielectric layer, which can be a silicon oxide layer formed by thermal oxidation. Moreover, the first conductive layer 204 is used for definition of a gate electrode, which can be a polysilicon layer. The second conductive layer 206 is used as a portion of the gate electrode to reduce the contact resistance of the entire gate electrode, which can be a metal silicide layer, for example, a tungsten silicide layer. The capping layer is used as a gate capping layer and a hard mask for definition of the gate structure.

Thereafter, the capping layer is patterned by conventional photolithography and etching to form patterned capping layers 208 on the second conductive layer 206, thereby defining the word line region.

Figure 2B:
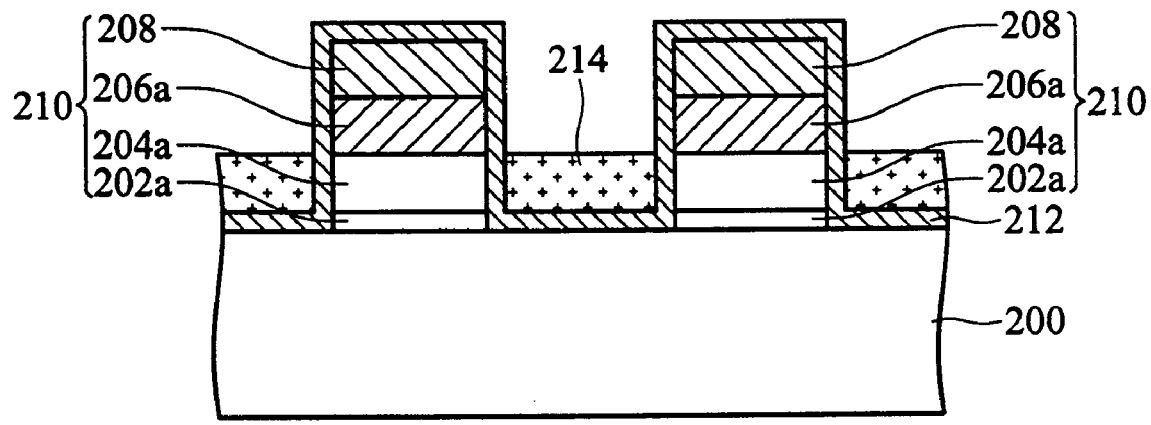

Next, in FIG. 2b, the second conductive layer 206, the first conductive layer 204, and the dielectric layer 202 are successively etched using the patterned capping layers 208 as etching masks, to expose the surface of the substrate 200 and form a pair of adjacent gate structures 210, each gate structure 210a is a stacked layer comprising a gate dielectric layer 202a, a first gate layer 204a, a second gate layer 206a and a gate capping layer 208.

Next, a thin oxide layer (not shown) with a thickness of about 100 Å is optionally formed over opposing sidewalls of the first gate layer 204a and the second gate layer 206a by rapid thermal process (RTP), serving as a pad oxide layer. Next, an insulating layer 212 is conformably formed on the exposed surface of the substrate 200 and the surface of the gate structure 210 by conventional deposition, such as CVD. Preferably, the insulating layer 212 comprises the same material as the gate capping layer 208, which has a thickness of about 1000 to 1800 Å. Thereafter, a masking layer (not shown), such as a photoresist layer or an antireflective layer, is formed overlying the substrate 200 and covers the gate structure 210. The masking layer is then etched to a predetermined depth, thereby leaving a portion of the masking layer 214 overlying the substrate 200 on opposite sides of the gate structure 210, so as to cover a portion of the insulating layer 212. The height of the remaining masking layer 214 is substantial the same or lower than the first gate layer 202a.

Figure 2C:
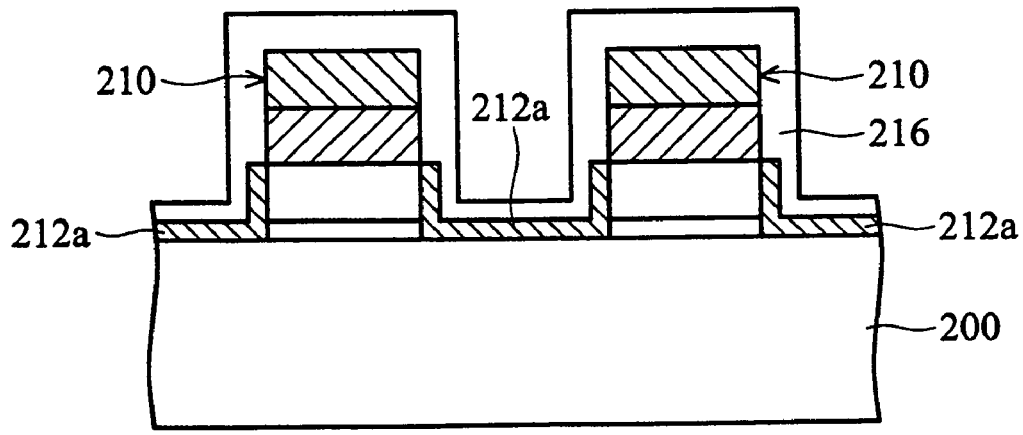

Next, in FIG. 2c, the insulating layer 212 above the masking layer 214 is removed to leave a portion of the insulating layer 212a and expose the gate capping layer 208 and the second gate layer 206a. The masking layer 214 is subsequently removed to expose the remaining insulating layer 212a. Next, another insulating layer 216 is conformably formed on the surfaces of the remaining insulating layer 212a and the gate structures 210. It is noted that the insulating layer 216 comprises a material different from the insulating layer 212a. Preferably, the insulating layer 216 can be a silicon oxide layer, with a thickness of about 100 to 300 Å.

Figure 2D:
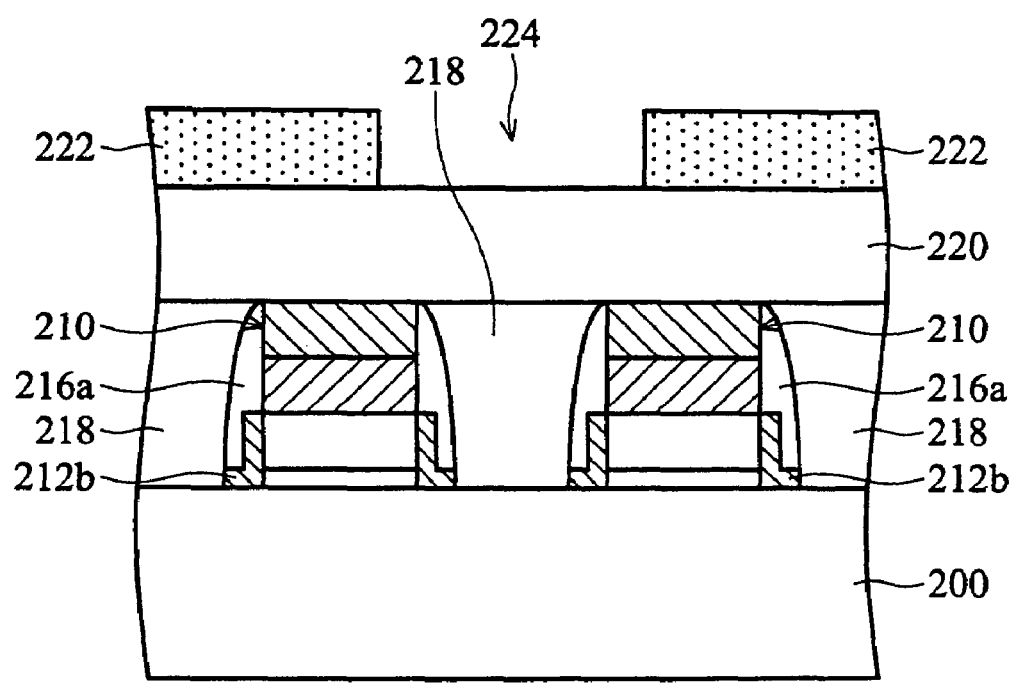

Next, in FIG. 2d, an anisotropic etching, such as RIE, is performed on the insulating layer 216 to form a gate spacer 216a over opposing sidewalls of each gate structure 210 and expose a portion of the insulating layer 212a. The insulating layer 212a uncovered by the gate spacers 216a is subsequently removed to expose the surface of the substrate 200. As a result, a gate spacer 212b is formed over opposing sidewalls of each gate dielectric layer 202a and first gate layer 204a, which is covered by the gate spacer 216a.

Next, a dielectric layer (not shown), such as a borophosphosilicate glass (BPSG) layer, is formed overlying the substrate 200 and covers the gate structures 210a and the gate spacers 216a. Next, an etching back process or CMP is performed on the dielectric layer using the gate capping layers 208 as stop layers to leave a portion of dielectric layer 218. Another dielectric layer 220, such as a tetraethyl orthosilicate (TEOS) oxide layer, is deposited on the gate structures 210a and the remaining dielectric layer 218. It is noted that the dielectric layer 218 may comprise the same material as the dielectric layer 220. That is, the dielectric layers 218 and 220 can be formed simultaneously without two deposition steps. Next, a photoresist pattern layer 212 is formed on the dielectric layer 220 by conventional photolithography, which has an opening 224 between the adjacent gate structures 212.

Figure 2E:
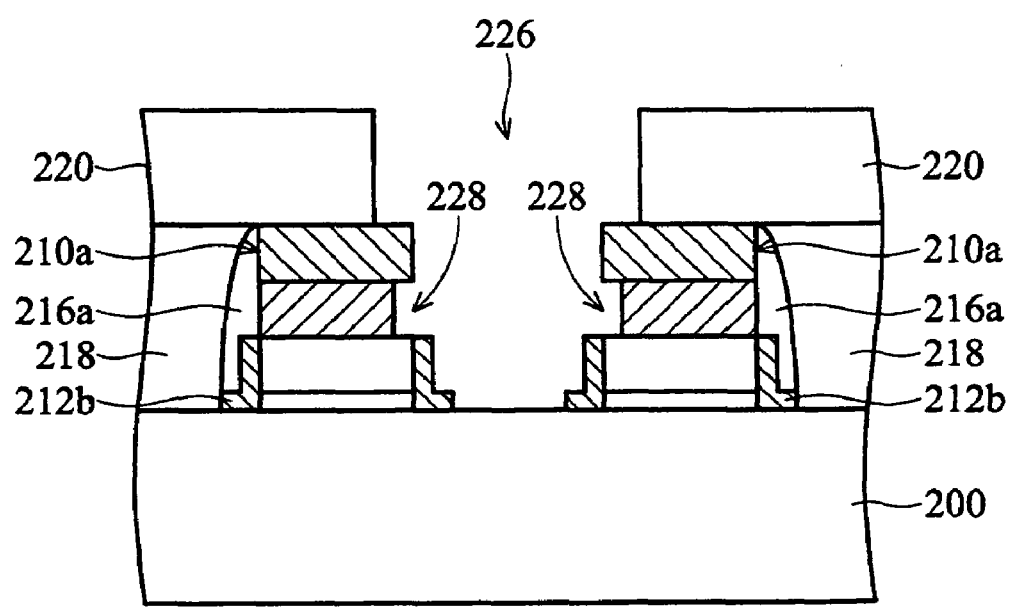

Next, in FIG. 2e, the dielectric layers 220 and 218 and the gate spacers 216a under the opening 224 are successively removed to form an opening 226 and expose the substrate 200 and portions of the gate spacers 208, the second gate layers 206a, and the gate spacers 212b. Here, the opening 226 is used as a bit line contact. The photoresist pattern layer 222 is subsequently removed.

Thereafter, each exposed second gate layer 206a is partially etched using a mixture of ammonia ($NH_3$) and hydrogen peroxide ($H_2O_2$) (i.e. APM), using the gate capping layer 208 and the gate spacer 212b comprising silicon nitride as etching masks, to form a recess region 228, thereby forming single-sided partially recessed gate structures 210a. Since each gate dielectric layer 202a is protected by the gate spacer 212b during etching, the gate dielectric layers 202a are not undercut. In the invention, the recess region 228 has a depth of about 100 to 200 Å.

Figure 2F:
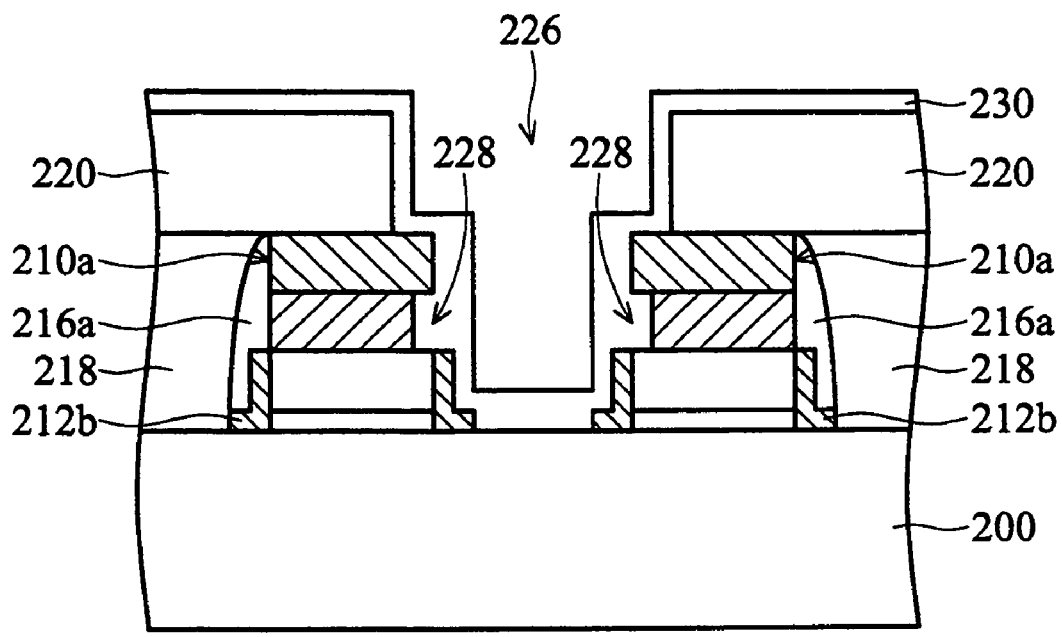

Next, in FIG. 2f, an insulating layer 230, such as a silicon oxide layer, is conformably formed on the dielectric layer 220 and the inner surface of the bit line contact 226 and fills the recess regions 228. The insulating layer has a thickness of about 100 to 300 Å.

Figure 2G:
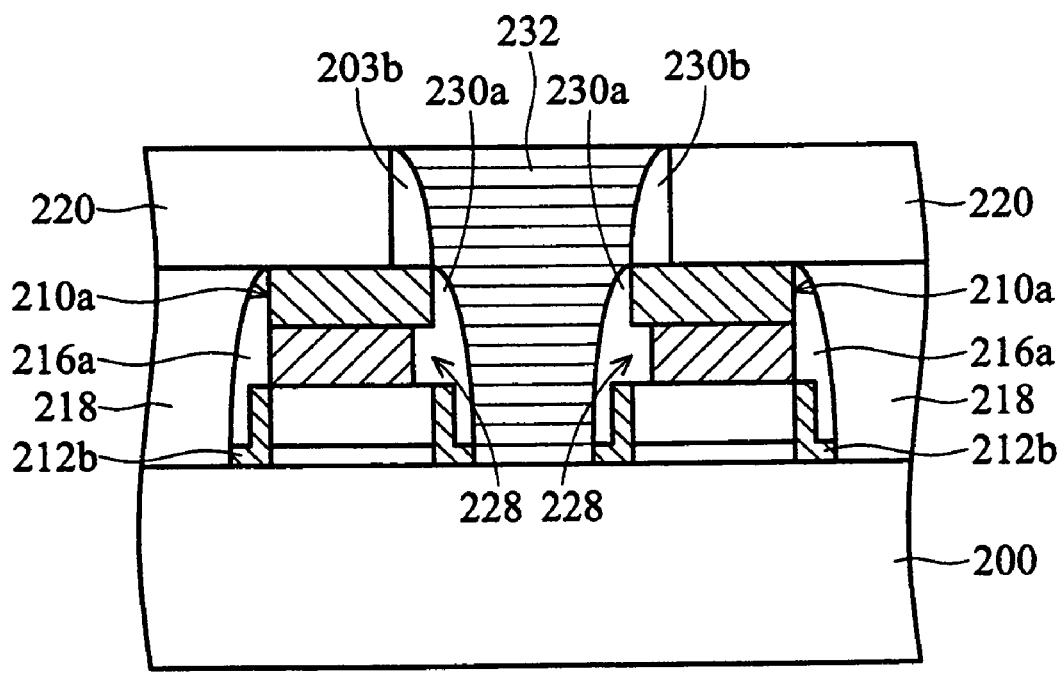

Next, in FIG. 2g, anisotropic etching, such as RIE, is performed on the insulating layer 230 to form gate spacers 230a and 230b over the sidewall of the bit line contact 226 and expose the surfaces of the dielectric layer 220 and the substrate 200. As a result, the fabrication of the word line structure with a single-sided recess gate is complete. Next, a conductive layer (not shown), such as a copper layer, is formed on the dielectric layer 220 and fills the bit line contact 226. Finally, an etching back process or CMP is performed on the conductive layer using the dielectric layer 220 as a stop layer to leave a portion of conductive layer 232 serving as a conductive plug for connection between the bit line (not shown) and the substrate 200.

FIG. 2g also illustrates a cross-section of a semiconductor device having a word line structure with a single-sided partially recessed gate structure of the invention. The word line structure includes a gate structure 210a and a plurality of gate spacers 212b, 216a, and 230a. The gate structure 210a is a stacked layer comprising a gate dielectric layer 202a, a first gate layer 204a, a second gate layer 206a, and a gate capping layer 208. The gate dielectric layer 202a can be a silicon oxide layer formed by thermal oxidation. The first gate layer 204a can be a polysilicon layer and the second gate layer can be a tungsten silicide layer. Moreover, the gate capping layer can be a silicon nitride layer. The gate structure 210a has a recess region 228 adjacent to one sidewall of the second gate layer 206a. The recess region 228 has a depth of 100 to 200Å. The gate spacer 212b is disposed over opposing sidewalls of the gate dielectric layer 202a and the first gate layer 204a, which comprises silicon nitride. The gate spacers 216a and 230a are respectively disposed over opposing sidewalls of the gate structure 210a and the gate spacer 212b is covered by the gate spacers 216a and 230a. Moreover, the gate spacers 216a and 230a comprise silicon oxide.

According to the invention, a short circuit between the word line and the conductive plug connected to the bit line or an open circuit of the bit line after forming the conductive plug with poor electrical connection can be prevented by the single-sided partially recessed gate structure.

Moreover, according to the invention, since the bit line contact 226 is formed prior to the partial etching of the second gate layer 204a, the single-sided recess region in the word line is formed near the bit line contact 226 only. Compared to the related art, loss of the top area of the gate layer can be reduced, thereby preventing the contact resistance of the word line from increasing.

Furthermore, compared to the main gate spacer comprising silicon nitride of the related art, the main gate spacer comprising silicon oxide of the invention can reduce the parasitic capacitance between the conductive plug connected to the bit line and the word line or between the word lines.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A word line structure with a single-sided partially recessed gate structure, comprising:
    a gate structure comprising a gate dielectric layer, a first gate layer, a second gate layer, and a gate capping layer, wherein the second gate layer is directly on the first gate layer, one of two opposing sidewalls of the second gate layer is inwardly recessed from one of two opposing sidewalls of the first gate layer to form a recess region, and the other sidewall of the second gate layer and the other sidewall of the first gate layer are substantially coplanar;
    a first gate spacer disposed over opposing sidewalls of the gate dielectric layer and the first gate layer; and
    a second gate spacer disposed over opposing sidewalls of the gate structure to cover the first gate spacer and fill the recess region.

2. The word line structure as claimed in claim 1, wherein the first gate layer is a polysilicon layer and the second gate layer is a metal silicide layer.

3. The word line structure as claimed in claim 2, wherein the second gate layer is a tungsten silicide layer.

4. The word line structure as claimed in claim 1, wherein the gate capping layer and the first gate spacer comprises silicon nitride.

5. The word line structure as claimed in claim 1, wherein the second gate spacer comprises silicon oxide.

6. The word line structure as claimed in claim 1, wherein the recess region has a depth of about 100to 200Å.

* * * * *